United States Patent [19]

Ioffe et al.

[11] 4,144,637
[45] Mar. 20, 1979

[54] DEVICE FOR MAKING SETS OF NONMAGNETIC CURRENT-CONDUCTING COMPONENTS

[75] Inventors: Benyamin A. Ioffe; Jury A. Zommer; Robert K. Kalnin; Alexandr S. Kanaev, all of Riga, U.S.S.R.

[73] Assignee: Institut Fiziki Akademii Nauk Latviiskoi SSR, U.S.S.R.

[21] Appl. No.: 756,987

[22] Filed: Jan. 5, 1977

[51] Int. Cl.² .............................................. H05K 3/30
[52] U.S. Cl. ....................................... 29/739; 29/744; 29/785
[58] Field of Search ................ 29/739, 740, 741, 744, 29/743, 785, 757

[56] References Cited

U.S. PATENT DOCUMENTS

| | | | |
|---|---|---|---|
| 3,386,156 | 6/1968 | Griesemer et al. | 29/744 X |
| 3,653,122 | 4/1972 | Powell, Jr. | 29/744 X |
| 3,789,483 | 2/1974 | DeVita et al. | 29/739 X |

FOREIGN PATENT DOCUMENTS 438515 1/1975 U.S.S.R. .................................. 29/744

Primary Examiner—Carl E. Hall
Attorney, Agent, or Firm—Robert E. Burns; Emmanuel J. Lobato; Bruce L. Adams

[57] ABSTRACT

A device for making sets of nonmagnetic current-conducting components on a base component in arrangements constituting identification patterns of the set being made. The device comprises a source of an alternating magnetic field, feeding the components arranged into a set as well as the base components into the working area of the magnetic field, and extractor means for removing the complete sets of components from the working area of the magnetic field. Each base component is a substrate comprising essentially a dielectric plate, fitted with inserts made from a current-conducting material and having cross section configurations similar to the cross-sectional shapes of the components being arranged into a set. The inserts arranged to determine the identification patterns of the set being made.

5 Claims, 21 Drawing Figures

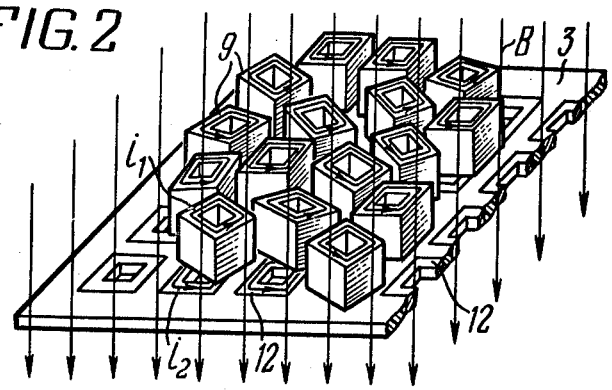
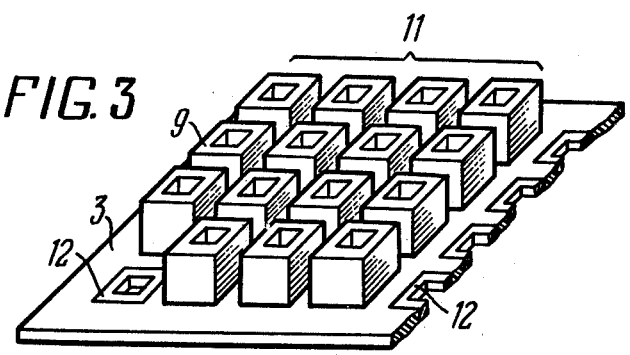
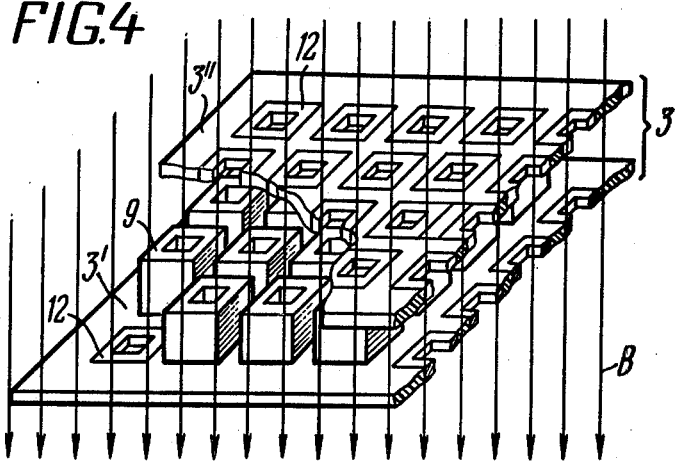

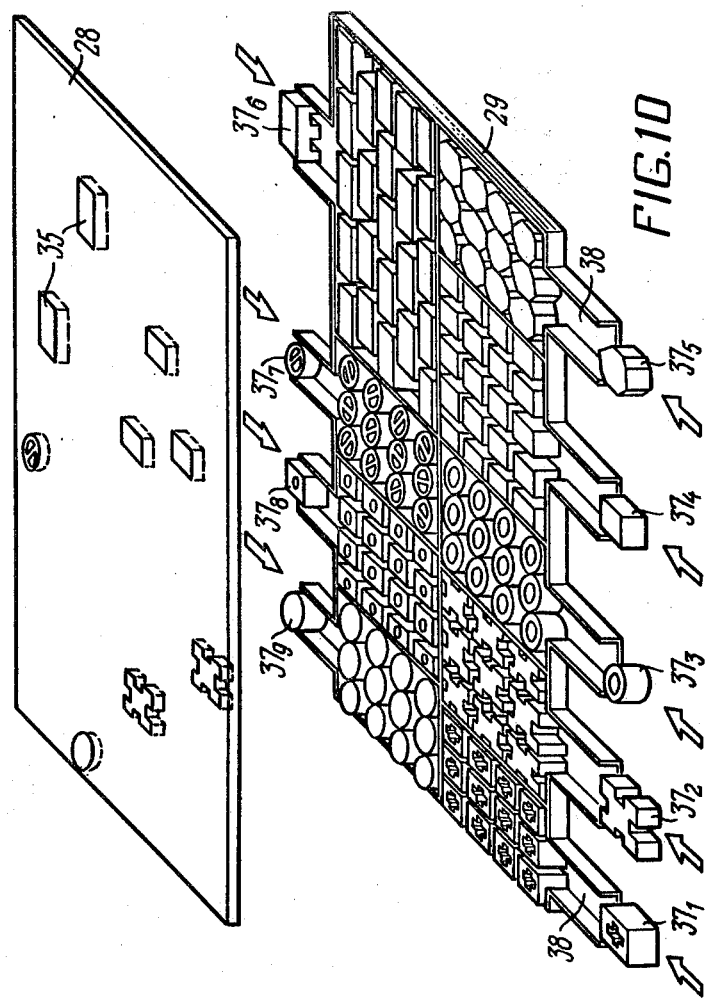

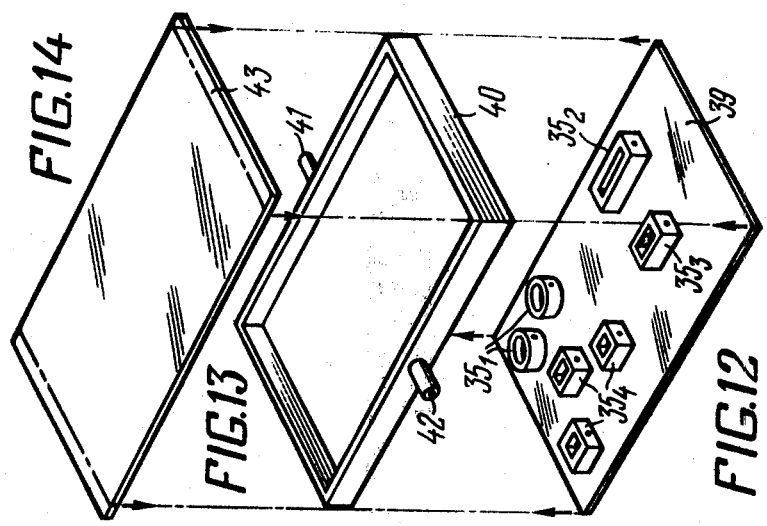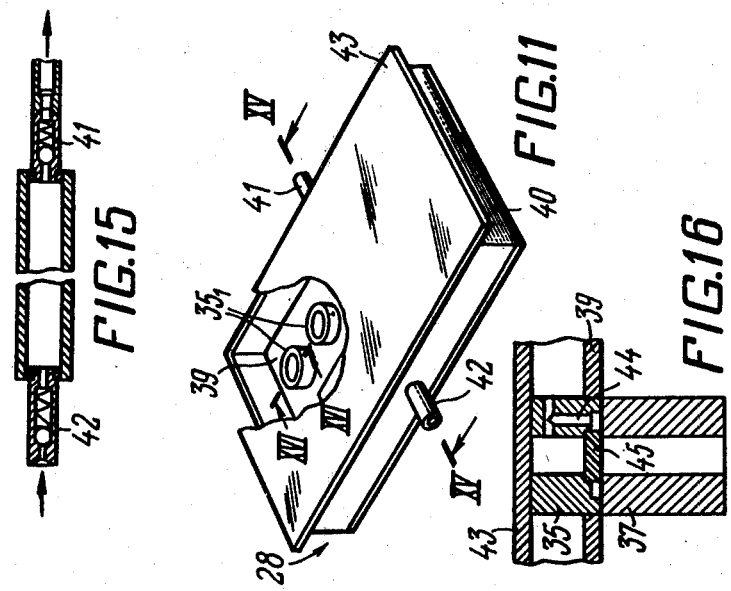

DEVICE FOR MAKING SETS OF NONMAGNETIC CURRENT-CONDUCTING COMPONENTS

BACKGROUND OF THE INVENTION

The present invention relates to production process automation systems, and more particularly to devices for making sets of nonmagnetic current-conducting components. Such a device can most advantageously be used in the manufacture of electronic, electrical and other units, where feeding of sets of components is required for treatment, assembling and other operations.

There is known a device for assembling sets of nonmagnetic current-conducting components on a base component or substrate with identification patterns of the set being made-up, which comprises a source of an alternating magnetic field, a means for feeding the components being arranged into a set and base components into the working area of the magnetic field, and a means for removing the made-up or assembled sets from the working area of the magnetic field.

In this prior art device, each base component is essentially a plate made from a current-conducting material with sockets (constituting identification patterns of the set being made) having cross section configurations corresponding to those of the mating surfaces of the components being arranged or made up into a set.

Making a set of components by the known prior art device resides in superimposing local magnetic fields directed along the axes of the sockets in the base component and having configurations similar and somewhat oversized with respect to that of the mating surface of a respective socket.

The known device permits making sets of components in a single process step only provided the components are sufficiently spaced apart to preclude interference with one another as a result of superimposing local magnetic fields. Otherwise, the process of making a set is broken down into several steps, each step consisting in arranging components, sufficiently spaced apart to preclude interference, along a respective group of axes.

SUMMARY OF THE INVENTION

It is an object of the present invention to provide a device for making-up sets of nonmagnetic current-conducting components on a base component with identification patterns of the set being made-up which will permit handling components no matter how short the distance therebetween may be.

Another object of the invention is to provide a device enabling a set of components to be made-up or assembled in a single process step.

Still another object of the invention is to provide a device enabling a set of components to be made-up by using a magnetic field common to all components.

Yet another object of the invention is to provide a device permitting spatial arrangement of a set of components at an angle to the plane of feeding components into the working area of the magnetic field.

These objects are attained by a device for making sets of nonmagnetic current-conducting components on a base component with identification patterns of the set being made, which has a source of an alternating magnetic field. Means are provided for feeding the components being arranged into a set as well as base components into the working area of the magnetic field, and ejector means provides for removing the complete sets from the working area of the magnetic field, according to the invention. Each base component is a workholder essentially comprising a dielectric plate, fitted with inserts made from a current-conducting material and having cross section configurations similar to the cross-sectional shapes of the components or workpieces being arranged into a set. The arrangements of the inserts define the identification patterns of the set being made-up.

It is expedient to make the inserts of different cross section configurations and to make each means for feeding components sectional, each section underlying a base component portion or workholder accommodating identical inserts and being provided with a feeder of components of a cross-sectional shape corresponding to the configuration of the inserts in that particular base component portion.

Individual base component portions should preferably be flexibly linked with one another so that one portion can be turned relative to another.

The inserts should preferably be made in the form of plates whose configurations and sizes correspond to the cross-sectional shape of the units of the set being made.

It is desirable that the base component be made up of two equally spaced plates with coaxially arranged inserts.

It is advisable that the magnetic field source be made up of six identical C-electromagnets evenly distributed along a turntable circumference, with their pole gaps facing outwards, and that the inserts correspond in size to the electromagnet pole gaps, each insert being made in the form of two parallel rigidly interconnected plates.

The proposed device for making sets of nonmagnetic current-conducting components, permits handling components no matter how short the distance therebetween may be, in a single process step by means of a magnetic field common to the entire set.

In an alternative embodiment, the proposed device has a sectional feeder, which permits making a set of components of different configurations in a single process step.

The base component is composed of flexibly linked portions permits complete sets of components to be delivered for further processing in different spatial orientations at different angles to the plane of delivery.

BRIEF DESCRIPTION OF THE DRAWINGS

The invention will now be described in greater detail with reference to specific embodiments thereof, taken in conjunction with the accompanying drawings, wherein:

FIG. 2 is an isometric view of a base component and the components being arranged into a set, according to the invention;

FIG. 3 is an isometric view of a base component with a complete set of components, according to the invention;

FIG. 4 is an isometric view of a base component made up of two plates, with a set of components, according to the invention;

FIG. 10 is an isometric view of a base component for making sets of components of different configurations and a sectional feeder of components, according to the invention;

FIGS. 11, 12 and 13 show individual portions of the base component for making sets of components of different configurations;

FIG. 14 shows the assembled base component whose individual portions are illustrated in FIGS. 11 to 13;

FIG. 15 is a section view taken along line XV—XV of FIG. 14;

FIG. 16 is a section view taken along line XVI—XVI of FIG. 11;

DESCRIPTION OF THE PREFERRED EMBODIMENTS

Figure 1:
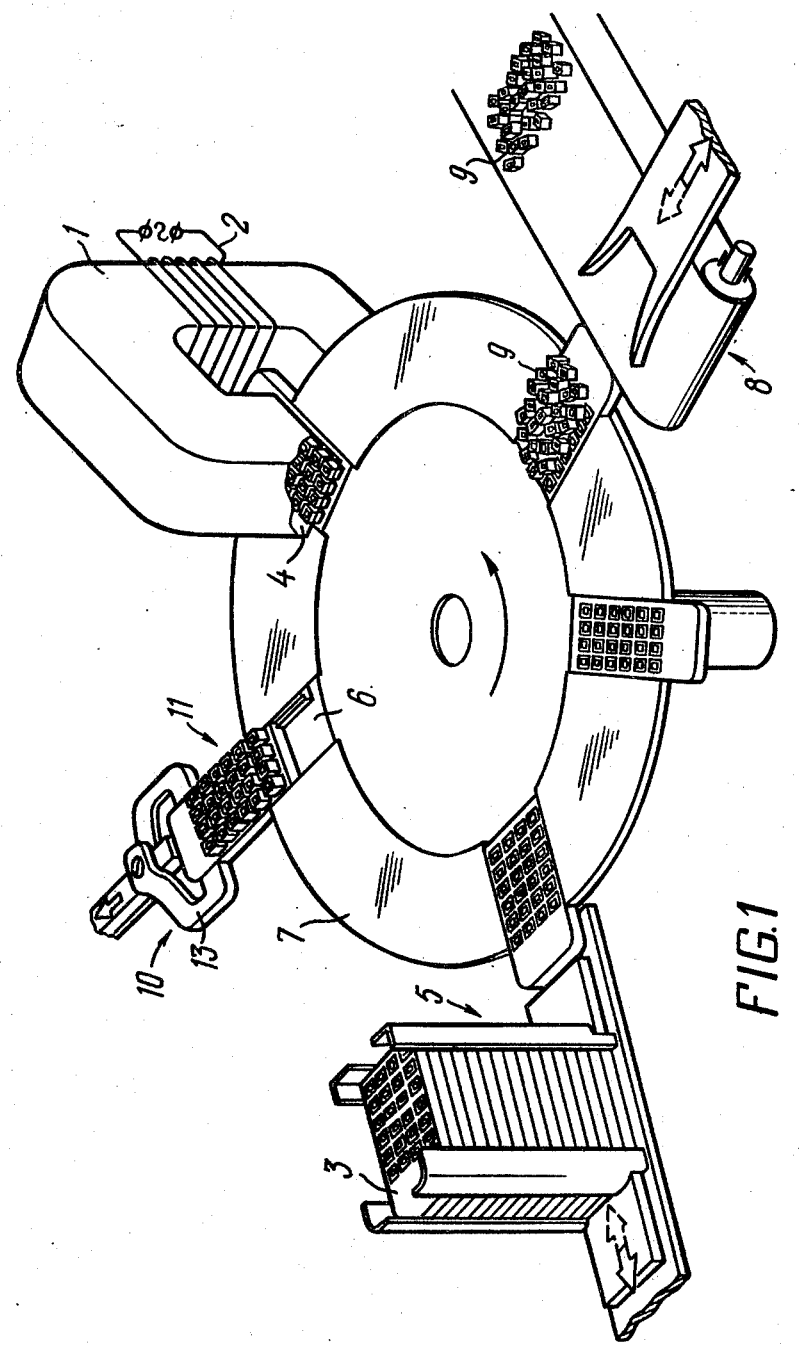
FIG. 1 is an isometric view of a device for making-up sets of nonmagnetic current-conducting components, according to the invention.

Referring now to FIG. 1, the device for making sets of nonmagnetic current-conducting components comprises a source of an alternating magnetic field, which is essentially an electromagnet 1 with a winding 2 connected to an a-c source (not shown). The device also includes a feed means 5 for feeding from a stacked condition base components or workholders 3 into the working area 4 of the magnetic field, i.e. into the pole gap of the electromagnet 1. The feed means 5 provides for setting of the base components or workholders 3 in sockets 6 defined by guide slots of a turntable 7. The latter has six guide sockets 6, for example, evenly distributed circumferentially thereon. The proposed device further comprises, a conveyor 8, for feeding groups of components or workpieces 9 to be arranged into a set in an ordered pattern onto the base components 3 set in the sockets 6, as well as extractor means 10 for removing complete sets 11 of components from the working area 4 of the magnetic field. The extractor means 10 is disposed outside the working area 4 of the magnetic field, in the direction of rotation of the turntable 7.

FIG. 2 is an isometric view of a base component or workholder 3 having thereon, randomly disposed, a group of nonmagnetic current-conducting components 9 to be arranged into a set. The base component 3 is essentially a plate made from a dielectric, e.g. fabric-base laminate, fitted with inserts 12 made from a current-conducting material, e.g. copper, aluminium, which serve to define the identification patterns of the set to be made. The individual inserts 12 correspond in configuration to the cross-sectional shape of the individual components 9 and are arranged on the plate (base component 3) in a manner similar to the arrangement of the components 9 in the completed set.

FIG. 3 is an isometric view of a base component 3 with a complete set 11 of components 9 arranged therein in a manner similar to the arrangement of the inserts 12.

The device shown in FIG. 1 operates as follows:

A base component or workholder 3 is fed by the feed means 5 into the nearest free socket 6. As the turntable 7 rotates two steps in one direction, this socket 6 is aligned with the conveyor 8, and a group of components 9 is fed, randomly disposed, therefrom onto the surface of the base component 3 set in the socket 6. The components 9 though randomly disposed should be grouped in such a manner that each of them must at least partially cover one of the inserts 12 (FIG. 2). As the turntable 7 (FIG. 1) rotates further, the socket 6 accommodating the base component 3 with the group of components 9 enters the working area 4 of the magnetic field of the electromagnet 1, the diagrammatic induction vector B (FIG. 2) denote flux normal to the surface of the base component 3. At the same time, currents $i_1$ and $i_2$ are induced in the components 9 and inserts 12, respectively. As a result of interaction of the magnetic fluxes corresponding to the currents $i_1$ induced in adjacent components 9, the latter are forced apart (the currents through adjacent components being opposite in direction) and, at the same time, owing to the effect of linkage of the magnetic fluxes corresponding to the currents $i_1$ and $i_2$, they are attracted to the inserts 12 in the base component 3, to be arranged coaxially therewith. The above-described interaction results in each individual component 9 being placed precisely above a respective insert 12 in the base component 3 (FIG. 3).

As the turntable 7 (FIG. 1) rotates another step in the same direction, the socket 6 with the complete set 11 of the components 9 is aligned with the means 10 for removing the complete sets, and the complete set 11 is transferred by means of a gripping device 13 from the socket 6 onto a conveyor (not shown) of the extractor means 10 which delivers the complete set 11 for further processing.

Upon leaving the working area 4 of the magnetic field, the complete set 11 may be retained on the surface of the base component 3 in any convenient way, for example, by the force of suction.

FIG. 4 is an isometric view of a base component 3 made up of two equally spaced dielectric plates 3' and 3", each having fitted thereinto coaxially arranged inserts 12. The spacing between the plates 3' and 3" is selected somewhat greater than the height of components 9.

Such an embodiment of the base component 3 provides for higher accuracy and speed of arranging the components 9 in a set, owing to the balancing out of the forces of cohesion between the current circuits directed perpendicularly to the surface of the base component 3.

Figure 5:
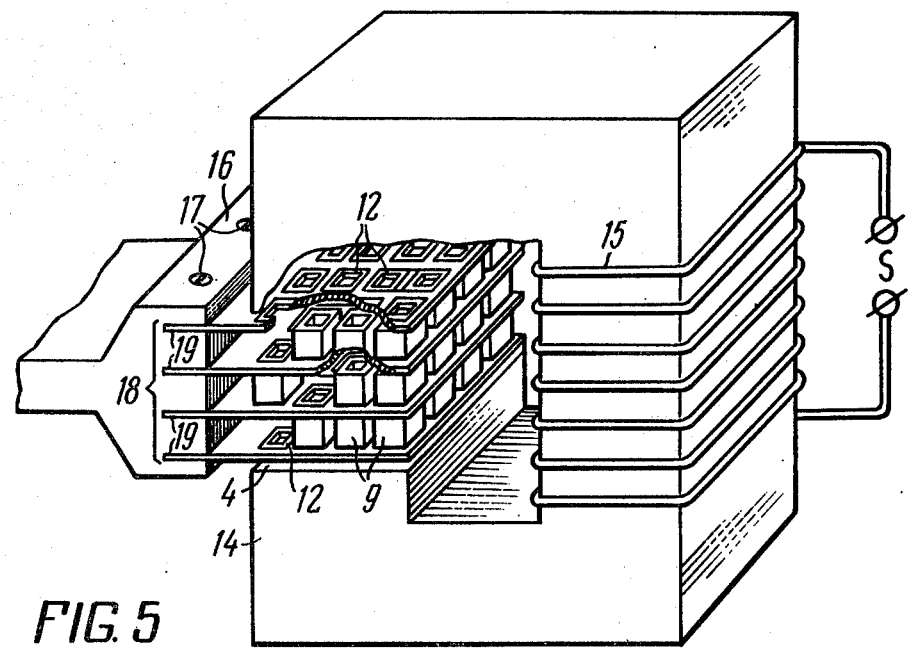
FIG. 5 is an isometric view of another embodiment of the proposed device for making three sets of components at a time, according to the invention.

FIG. 5 is an isometric view of an embodiment of the proposed device for making three sets of components at a time.

The device shown in FIG. 5 comprises a C-electromagnet 14 with a winding 15 connected to an a-c source (not shown), and a rotatable holder 16 having index pins 17 for securing therein a base component 18 made up of four parallel dielectric plates 19 with coaxially arranged current-conducting inserts 12.

This device operates in the following manner.

In the initial position, the holder 16 is outside the working area 4 of the magnetic field of the electromagnet 14. Three groups of components 9 are fed into the spaces between the plates 19 by means of, for example, a three-channel tray (not shown). Then, the holder 16 with the base component 18 and components 9 to be arranged into sets are introduced into the working area 4 of the magnetic field. In the latter, under the action of electrodynamic forces, the components 9 are aligned with the inserts 12 in all of the three spaces between the plates 19 at a time. The holder 16 is then removed from the working area 4 of the magnetic field, the index pins 17 are extracted, and the plates 19 with complete sets of components 9 retained thereon, for example, by means of suckers (not shown), are delivered for further processing.

In the case of making sets of components 9' (FIG. 6) with curvilinear surfaces, it is expedient to use a base component made up of two equally spaced bent plates 21, the radius of curvature whereof is determined by the curvature of the surfaces of the components 9' being arranged into a set. The plates 21 are made from a dielectric and have fitted thereinto inserts 12 of a current-conducting material, corresponding in shape to the components 9'.

Figures 6, 7:
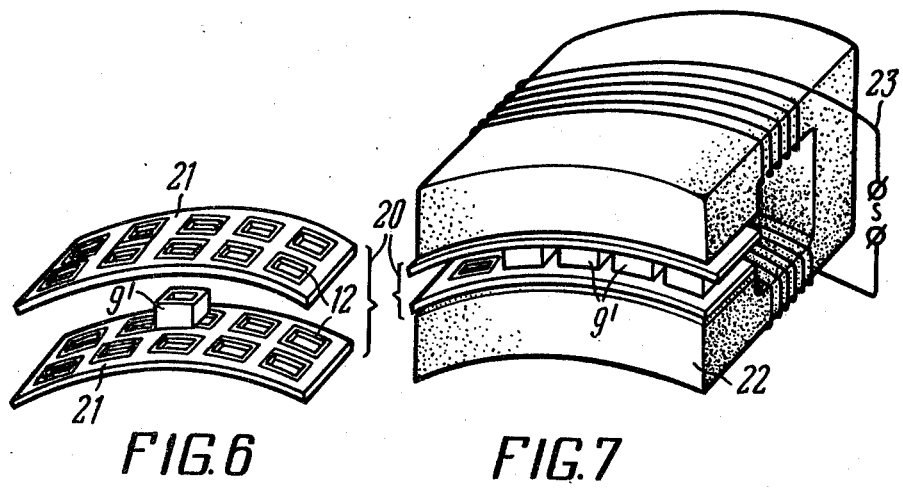
FIG. 6 is an isometric view of a base component made in the form of two equally spaced bent plates, according to the invention.
FIG. 7 is an isometric view of a third embodiment of the proposed device for making sets of components on the base component of FIG. 6, according to the invention.

FIG. 7 is an isometric view of an electromagnet 22 with a winding 23 connected to an a-c source (not shown). Disposed in the pole gap of the electromagnet 22 is the base component 20 with components 9'. The surfaces of the pole tips of the electromagnet 22 are bent similarly to the plates 21 of the base component 20.

A device for making sets of components 9' can be made similar to that shown in FIG. 5 use should be made of the electromagnet 22 and the holder of the plates 21 should be adapted to reciprocate with respect to the pole gap of the electromagnet 22.

Figure 8:
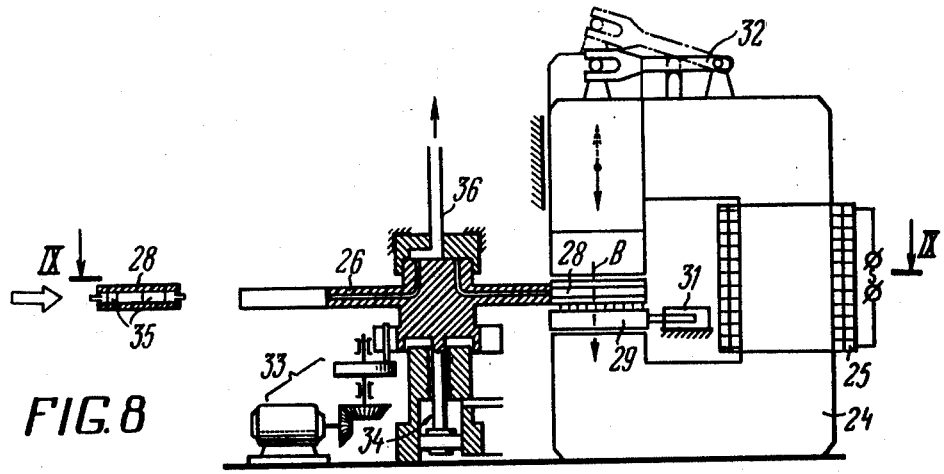
FIG. 8 is a cross-sectional view of a fourth embodiment of the proposed device with a sectional feeder, according to the invention.
Figure 9:
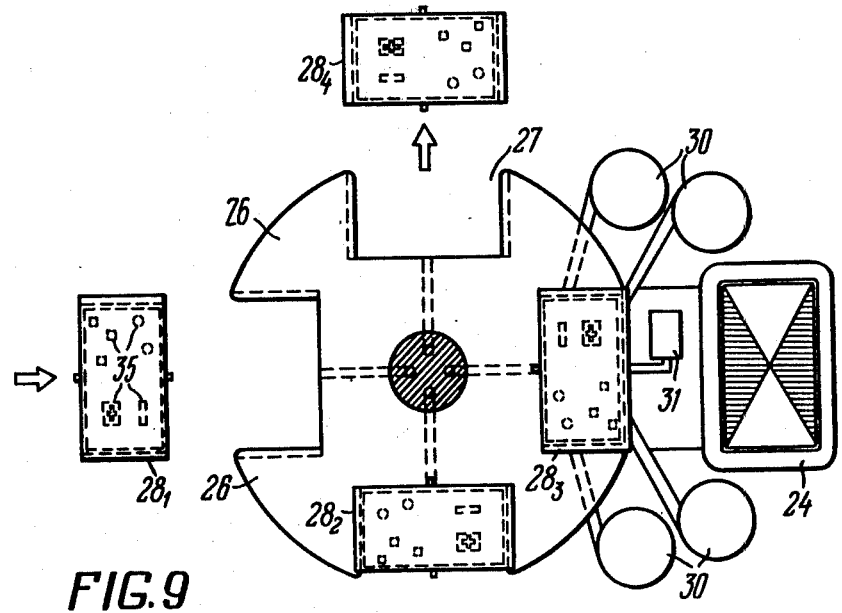
FIG. 9 is a plan view of the device of FIG. 8.

Shown in FIGS. 8 and 9 is an embodiment of the device for making sets of nonmagnetic current-conducting components of different configurations on a base component.

FIG. 8 is a general longitudinal section view of the device, while FIG. 9 is a plan view of the same device, taken along line IX—IX of FIG. 8.

The device comprises a C-electromagnet 24 with a winding 25 and a driven turntable 26 having four sockets 27 to accommodate base components 28 fed, for example, by means of a belt conveyor (not shown). The means 29 for feeding components into the pole gap of the electromagnet 24 is made sectional, each section being intended to receive components of the same configuration and provided with its own feeder for delivering components from a respective vibrating bin 30. Uniform loading of the feeding means 29 with components to be arranged into a set is ensured by a vibrator 31. The electromagnet 24 is provided with an adjustable pole gap, the adjustment of the gap being accomplished by means of a lever mechanism 32.

The turntable 26 is rotated by a drive 33 including an electric motor, a bevel gearing and a Geneva cross imparting intermittent motion to the turntable 26. To take out a complete set of components use is made of a hydraulic drive 34 which moves the turntable 26 along its axis of rotation. Base components 28 made from a dielectric are provided with identification patterns of the set being made, i.e. inserts 35 made from a current-conducting material. The desired arrangement of components in the complete set as it is delivered for further processing is maintained by means of a vacuum grip system 36.

FIG. 10 is an enlarged isometric view of the sectional feeding means 29 with a base component 28 positioned thereabove and having current-conducting inserts 35 of different configurations, the inserts being arranged therein in accordance with the desired arrangement of components $37_1$, $37_2$, $37_3$, $37_4$, $37_5$, $37_6$, $37_7$, $37_8$ and $37_9$ in the set being made.

In this particular embodiment, the feeding means 29 has nine sections each being provided with its own feeder 38 for feeding components $37_{1-9}$ of the required configuration. Individual sections of the feeding means 29 are filled with components $37_{1-9}$ so that under each portion of the base component 28 with identical inserts 35 there is a section filled with components $37_{1-9}$ corresponding in shape and size to respective inserts 35, as can be seen from FIG. 10.

The structure of an embodiment of the base component is shown in detail in FIGS. 11, 12, 13, 14, 15 and 16.

FIG. 11 is a general isometric view of the base component 28.

FIGS. 12, 13 and 14 illustrate constituent parts of the base component, FIG. 12 showing, in particular, a detachable base plate 39 made from a dielectric with four types of current-conducting inserts $35_1$, $35_2$, $35_3$ and $35_4$ arranged in accordance with the desired arrangement of components in the set to be made. FIG. 13 represents a frame 40 with a vacuum valve 41 being fitted in one of its walls and a valve 42 for restoring normal pressure in the inner space of the base component, being fitted in the opposite wall. The valves 41 and 42 can be clearly seen in FIG. 15 which is a section view taken along line XV—XV of FIG. 11, FIG. 15 shows that these are conventional ball valves with springs of different tensions (the tension of the spring of the valve 41 is designed for the latter to operate at a negative pressure of about 0.2 atm, while that of the spring of the valve 42 is designed for the valve to operate at a negative pressure of about 1 atm).

FIG. 14 is an isometric view of a cover plate 43 of the base component. The size of the cover plate 43 is selected such as to provide for the base component 28 (FIG. 9) to be locked in position in the sockets 27 of the turntable 26.

FIG. 16 is a section view taken along line XVI—XVI of FIG. 12. It shows, in cross section, one of the inserts 35 in the base component 28. Each insert 35 has ports 44 through which the surface of the insert mating with a respective component 37 is associated with the inner space of the base component 28. More intimate mating is ensured by the provision of a gasket 45.

The device illustrated in FIGS. 8 and 9 operates as follows.

Base components 28 are fed to one of the sockets 27 of the turntable 26. When a base component 28 is brought, by the rotation of the turntable 26 actuated by the drive 33, into the pole gap of the electromagnet 24 and is positioned above the sectional feeding means 29 with components 37, (FIG. 10), and the inserts 35 in the base component come in contact with the components 37, the winding 25 (FIGS. 8 and 9) is energized and set up in the pole gap is an alternating magnetic field whose induction vector B is normal to the surface of the base component 28. As a result of interaction between the magnetic fluxes corresponding to the currents induced both in the components to be arranged into a set and in the inserts 35, the components cohere to the surface of the base component, particularly, to respective inserts 35 fitted therein. The complete set of components is held on the surface of the base component 28 by means of the vacuum grip system 36. Then, the lever mechanism 32 retracts the movable pole of the electromagnet 24 and, at the same time, the hydraulic drive 34 moves the turntable 26 (upward, as is shown in FIG. 8) for a distance at least exceeding the linear size of the components being arranged into a set, in the direction of action of the magnetic field. The magnetic field is then deactivated, the turntable 26 turns through one step (in this case, through 90°), and the base component 28 with the complete set of components is transferred onto a conveying means (not shown) to be delivered for further processing. At the same time, the movable pole of the electromagnet 24 returns to the initial position, the next base component 28 enters the pole gap, and the above-described process is repeated.

The relatively large evacuated inner space of the base component 28 (FIG. 11) ensures reliable holding of the complete set of components, as it is being transferred, even if there is some clearance between the surfaces of the inserts 35 and respective components. The complete set of components is removed from the surface of the base component 28 by means of the valve 42 whose ball must be depressed for this purpose.

Figure 17:
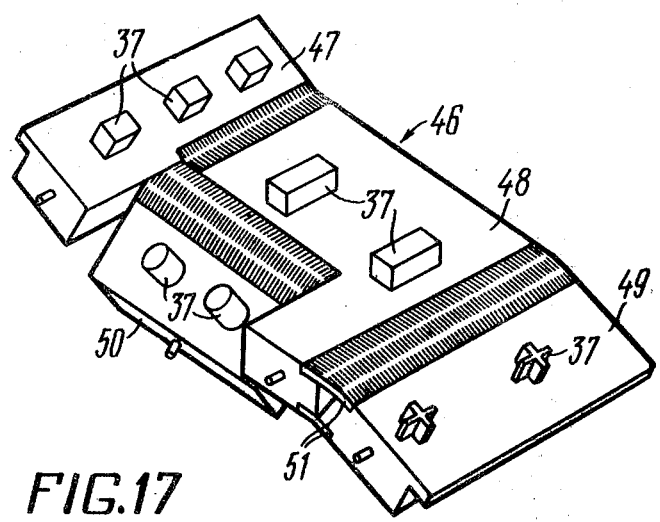
FIG. 17 is an isometric view of a base component with flexible links, according to the invention.

Should the need arise to spatially orientate a complete set of components 37 (at different angles, in different planes), recommended for use is a composite base component 46 illustrated in FIG. 17, which is flat in the initial position (when a set is being made in the pole gap of the electromagnet). Once a complete set of components has been delivered for further processing, the configuration of the base component can be changed for handling components 37 in a different spatial orientation. This is achieved owing to the base component 46 being made up of several portions 47, 48, 49 and 50 associated with one another through a flexible link 51 so that each portion can be turned with respect to another. Structurally, each one of the portions 47 to 50 is similar to the base component 28 considered above in detail with reference to FIGS. 11 to 16.

Figure 18:
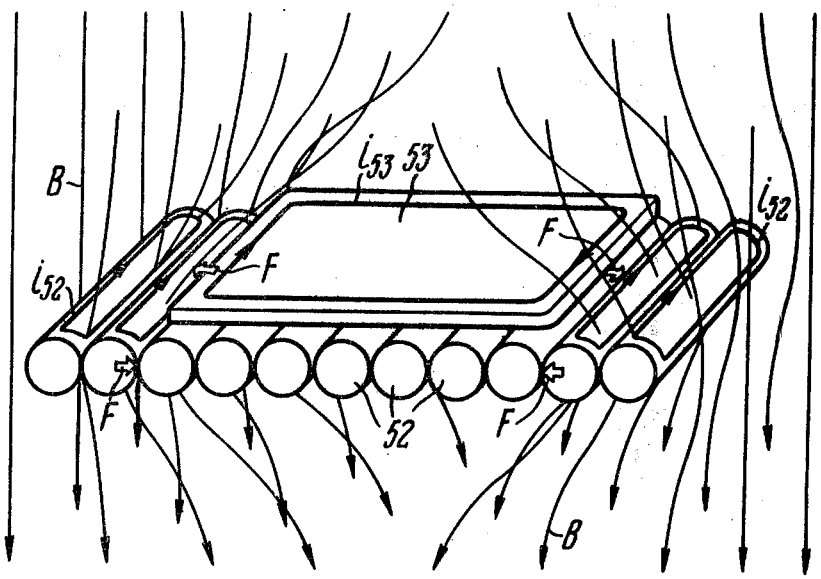
FIG. 18 is an isometric view of the components being arranged into a set and a base component for separating the complete set of nonmagnetic current-conducting components from the continuous flow of components, according to the invention.

In addition, the proposed device can be used for non-contact separation of a set of nonmagnetic current-conducting components from the continuous flow of such components. In this case, the base component incorporates a single insert made in the form of a plate and corresponding in configuration and in size to the entire complete set of components to be separated. This embodiment of the proposed device is illustrated in FIG. 18 showing the case where a set of rods 52 must be separated from a continuous flow of rods. The base component has an insert 53 in the form of a plate from a current-conducting material, corresponding in size to the cross section of a group of seven rods 52. The insert 53 is positioned above the flow of rods 52 so that the induction vector B of the alternating magnetic field is normal to the plane of the insert 53. In this case, the primary magnetic field interacts with currents $i_{53}$ and $i_{52}$ induced in the insert 53 and rods 52, respectively. The insert 53 acts as a screen separating the group of rods 52 from the primary magnetic field. This is due to the fact that the circuit of the induced current $i_{53}$ displaces the primary magnetic field beyond the insert 53.

As a result of interaction of the magnetic fluxes corresponding to the currents $i_{52}$ induced in the rods 52 which are beyond the insert 53 with the magnetic flux corresponding to the current $i_{53}$ induced in the insert 53, a heavy concentration of the magnetic field along the periphery of the insert 53 takes place. Therewith, oppositely directed electrodynamic forces F are created, some of these forces holding the rods 52 closely together, namely, those rods which directly underline the insert 53, while the other forces, acting in the opposite direction, push away the rods 52 which are beyond the insert 53 from the group of rods to be separated from the continuous flow.

When it is necessary to alter the number of components to be separated from the continuous flow of components, one should, all other things being equal, change the size of the base component insert, accordingly. The base component insert determining the number of components to be separated, as well as their configuration, can be positioned both above the flow of components, as is shown in FIG. 18 and under it. The action of the magnetic field becomes stronger if the base component is arranged on either side of the component flow. This can be explained by the stronger effect of screening the primary magnetic field in the zone of separation of components.

Figure 19:
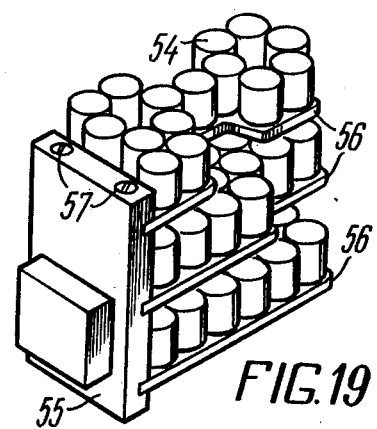
FIG. 19 is an isometric view of a base component for simultaneous separation of three complete sets from the continuous flow of components, according to the invention.

Shown in FIG. 19 is an embodiment of the proposed device intended for separation of three sets of components 54 passing in three flows. The base component comprises a dielectric holder 55 with three inserts 56 made from a nonmagnetic current-conducting material and secured in the holder 55 by means of index pins 57. The holder 55 is provided with a protruding portion 58 enabling the base component to be positioned on the rotating turntable similarly as it was done in the embodiment of FIG. 1. The pattern of arrangement of components in each set being separated and their number are determined by the configuration and size of a respective insert 56.

Such base components may be used to simultaneously separate different types of components in each set, which is achieved by feeding into the magnetic field different types of components in three flows.

The distance between the inserts 56 of the base component is selected to ensure free passage of the components being fed under the inserts.

Figure 20:
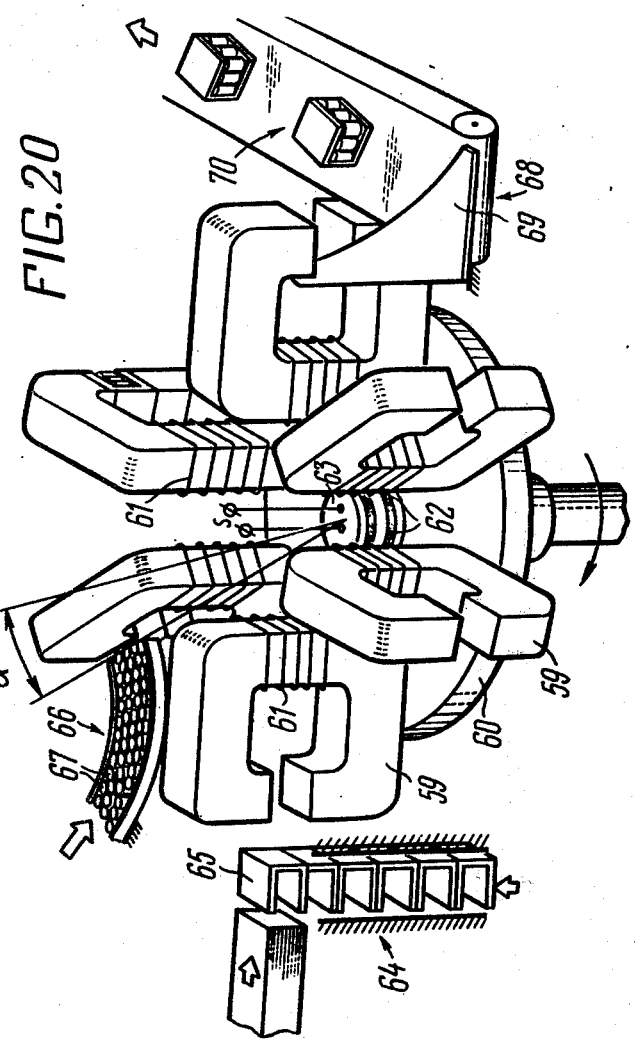
FIG. 20 is an isometric view of an automatic device for separating complete sets from the continuous flow of components, according to the invention.

FIG. 20 represents an embodiment of an automatic device for making sets of nonmagnetic current-conducting components fed in a continuous flow. The device comprises six C-electromagnets 59 evenly distributed along the circumference of a turntable 60, with their pole gaps facing outwards. Each electromagnet 59 has a winding 61 connected by means of sliding brushes 62 to a commutator 63 stationary with respect to the turntable 60. The device also comprises a means 64 for feeding base components 65 into the pole gaps of the electromagnets 59, which means is, in this embodiment, made in the form of a gate, a feeder 66 for feeding components 67 to be arranged into a set, the feeder being, in this embodiment, a vibration bin tray, and a conveyor 68 with a pusher 69 for delivering complete sets 70 of components. The drive of the turntable 60 is not shown. Each base component 65 is made to fit the pole gaps of the electromagnets 59, in the form of two vertically spaced parallel plates made from a current-conducting material, which plates are rigidly interconnected forming a C-configuration clamp.

The device shown in FIG. 20 operates as follows.

As the turntable 60 turns to a position wherein one of the electromagnets 59 is aligned with the means 64 for feeding base components 65, a base component 65 enters the pole gap of this electromagnet 59, with the back of the C-clamp workholder facing the center of the turntable 60. As the turntable 60 rotates further, the electromagnet 59 with the base component 65 approaches the feeder 66 with components 67. As this takes place, the base component 65 brackets, from top and bottom, the flow of components 67 moving on the tray of the feeder 66. Precisely at this moment, the winding 61 of the electromagnet 59 with the base component 65 in its pole gap is energized by an a-c source (not shown). The winding 61 of the electromagnet 59 remains energized for a period of time it takes the turntable 60 to turn through an angle α, after which period the electromagnet 59 leaves the zone of interaction with the flow of components 67. The winding 61 of any electromagnet 59 is energized in a pulsed manner, which is attained by that one terminal of winding 61 is connected by means of a sliding brush 62 to a bus of the commutator 63 which, in turn, is connected to the power supply. The bus of the commutator 63 has a current-conducting portion only in the sector α. The other terminals of the windings 61 of the electromagnets 59 are interconnected and coupled through another sliding brush (not shown) to the second bus of the commutator 63. As the winding 61 of the electromagnet 59 is energized, an alternating magnetic field is set up, whose induction vector is normal to the planes of the parallel plates of the base component 65. In this case, the group of components 67, bracketed by the base component 65, is separated from the flow of components, and, as the turntable 60 goes on rotating, it moves together with the base component 65 towards the conveyor 68 which delivers complete sets of components for further processing. The physical processes occurring therewith have been described above with reference to FIG. 18. As the electromagnet 59 with the complete set 70 of components is aligned with the conveyor 68, the set 70 is pushed by the pusher 69 from the pole gap of the electromagnet 59 onto the conveyor 68 which takes the set 70 away.

This device can be easily readjusted by using a base component of the required configuration instead of the base component 65. In addition, the electromagnets 59 can be easily made with variable pole gaps, as was the case with the embodiment illustrated in FIG. 8.

It should be noted at this point that electromagnets of any other type can be mounted on the turntable 60 instead of the C-electromagnets 59 shown in FIG. 20.

Figure 21:
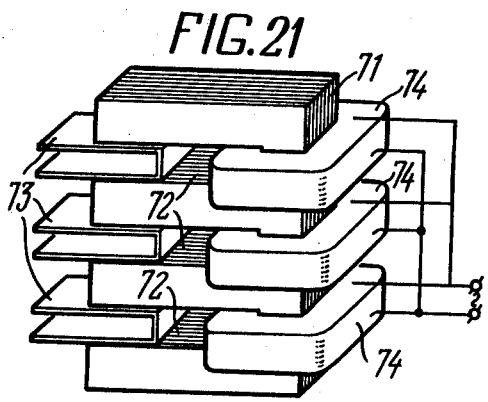
FIG. 21 is a side elevation view of an embodiment of an electromagnet for the device of FIG. 20, according to the invention.

FIG. 21 shows, in particular, an electromagnet permitting simultaneous separation of sets of components from three component flows.

Such an electromagnet has a magnetic circuit 71 with three pole gaps 72, each accommodating a base component 73. The terminals of the electromagnet windings 74 are interconnected to create a common magnetic flux passing through all pole gaps 72.

The arrangement of the windings 74, shown in FIG. 21, permits creating the required magnetic flux both in all the pole gaps 72 and in one or more pole gaps. This makes it possible to cut down the power requirements if there is no necessity to make several sets of components from all component flows at a time.

Thus, the above considered embodiments of the proposed device permit group separation of components both from a single flow and several flows at a time.

What is claimed is:

1. A device for arranging in a given pattern of arrangement sets of workpieces on corresponding workholders comprising means for delivering workholders to successive stations, means to deliver to said workholders at one of said stations a plurality of alike electrically-conductive workpieces to be arranged on the individual workholders in a given pattern thereon, pattern-arranging means for arranging the workpieces on corresponding workholders in a given pattern of arrangement including electrically-conductive means on the individual workholders and including electromagnetic means developing magnetic fields distributed by said electrically-conductive means on the workholders for arranging the workpieces thereon in a given pattern of arrangement, means energizing the electromagnetic means intermittently when workholders with workpieces thereon are at said electromagnetic means, and extractor means at a station at which the workholders are received with the workpieces thereon in a given pattern for extracting the workholders and workpieces thereon for delivery elsewhere.

2. A device for arranging in a given pattern of arrangement sets of workpieces on corresponding workholders according to claim 1, in which said electrically-conductive means on the workholders comprises a plurality of inserts thereon each having a cross section corresponding in cross section configuration to the cross section configuration of the individual workpieces.

3. A device for arranging in a given pattern of arrangement sets of workpieces on corresponding workholders according to claim 2, in which said workholders each comprises a non-conductive plate.

4. A device for arranging in a given pattern of arrangement sets of workpieces on corresponding workholders according to claim 1, in which said workholders are C-shaped and electrically conductive, and in which said electromagnetic means comprises an electromagnet having a gap in which the workholders are received, and means for energizing the electromagnet intermittently when the workholders with workpieces are in the gap thereof.

5. A device for arranging in a given pattern sets of workpieces on a substrate comprising, transport means moved stepwise to a plurality of stations for transporting to several of said stations discrete groups of non-magnetic, current-conductive workpieces made of a nonmagnetic current-conducting material; means at a first station for delivering a plurality of substrates sequentially individually onto said transport for movement from station to station, each substrate having thereon current-conducting elements arranged in a given pattern and having a cross section corresponding to the cross section of said workpieces, feed means at a second station for delivering onto individual substrates received successively at said second station a corresponding group of said workpieces randomly arranged overlying said current-conducting elements, means at a third station for developing an alternating field passing through said current-conducting workpieces and said elements when the substrates from said second station are received at said second station successively with workpieces thereon and for effecting induced currents through said elements and said workpieces to effect alignment of said randomly disposed workpieces with said elements in a precise pattern corresponding to a pattern of arrangement of said elements, and extractor means at a fourth station of said substrates for extracting said substrates sequentially with said workpieces aligned thereon in said pattern.

* * * * *